(12) United States Patent
Russell et al.

(10) Patent No.: US 7,166,543 B2
(45) Date of Patent: Jan. 23, 2007

(54) METHODS FOR FORMING AN ENRICHED METAL OXIDE SURFACE FOR USE IN A SEMICONDUCTOR DEVICE

(75) Inventors: Stephen W. Russell, Boise, ID (US); Max Hineman, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 224 days.

(21) Appl. No.: 10/929,173

(22) Filed: Aug. 30, 2004

(65) Prior Publication Data

US 2006/0046517 A1  Mar. 2, 2006

(51) Int. Cl.
*H01L 21/31* (2006.01)
*H01L 21/469* (2006.01)

(52) U.S. Cl. .............. 438/778; 438/687; 438/622; 438/669; 438/720; 438/754; 257/E21.3; 257/E21.31; 257/E21.582

(58) Field of Classification Search .......... 438/778, 438/687, 622, 669, 720, 754; 257/E21.3, 257/E21.31
See application file for complete search history.

(56) References Cited

U.S. PATENT DOCUMENTS

| | | | |
|---|---|---|---|
| 5,468,445 A * | 11/1995 | Casey et al. | 419/19 |
| 6,143,657 A | 11/2000 | Liu et al. | |
| 6,261,953 B1 | 7/2001 | Uozumi | |
| 6,380,083 B1 | 4/2002 | Gross | |
| 6,417,112 B1 * | 7/2002 | Peyne et al. | 438/754 |
| 6,602,653 B1 * | 8/2003 | Geusic et al. | 430/317 |
| 2005/0048794 A1 * | 3/2005 | Brask et al. | 438/768 |

* cited by examiner

*Primary Examiner*—B. William Baumeister
*Assistant Examiner*—Igwe U. Anya
(74) *Attorney, Agent, or Firm*—Dinsmore & Shohl LLP

(57) ABSTRACT

Methods of forming a metal oxide surface that is enriched with metal oxide in its higher oxidation state for use in a semiconductor device are provided. A metal oxide surface that is enriched with metal oxide in its higher oxidation state for use in a semiconductor device is also provided.

55 Claims, 2 Drawing Sheets ness of the present invention will be more fully understood

METHODS FOR FORMING AN ENRICHED METAL OXIDE SURFACE FOR USE IN A SEMICONDUCTOR DEVICE

FIELD OF THE INVENTION

The present invention relates to methods for forming a metal oxide surface on a metal layer, and more particularly, to methods for forming a metal oxide surface that is enriched with metal oxide in its higher oxidation state for use in a semiconductor device.

BACKGROUND OF THE INVENTION

The metal layer(s) in a semiconductor device are usually damaged from exposure of the metal layer to oxygen during the dielectric etching process. Even though the metal oxide created from the oxygen exposure is removed, for example, with an acidic solution, the exposure results in substantial diffusion and penetration of oxygen into the metal layer. Moreover, extensive metal oxide formation and subsequent removal can easily result in retrograde profiles in a structure, which will reduce the amount of metal available for assembly plating and wire bonding.

Thus there remains a need to develop methods for limiting oxidation to the surface of the metal layer to not only minimize the diffusion and penetration of oxygen in the metal layer, but also to avoid substantial reduction in the amount of metal available for assembly plating and wire bonding.

SUMMARY OF THE INVENTION

These needs are met by embodiments of the present invention that provide methods for forming a metal oxide surface on a metal layer that is enriched with metal oxide in its higher oxidation state for use in a semiconductor device.

In accordance with one embodiment of the present invention, a method of forming a metal oxide surface that is enriched with metal oxide in its higher oxidation state for use in a semiconductor device is provided. The method comprises: providing a metal layer supported by a semiconductor substrate; and forming a metal oxide surface that is enriched with metal oxide in its higher oxidation state on the metal layer. The step of forming the enriched metal oxide surface comprises: oxidizing the metal layer to form a metal oxide surface, wherein the metal oxide surface comprises metal oxide in a first oxidation state; reducing the metal oxide surface, wherein the reduced metal oxide surface comprises metal oxide in a first oxidation state and metal atom; and re-oxidizing the reduced metal oxide surface to form a metal oxide surface that is enriched with metal oxide in its higher oxidation state, wherein the enriched metal oxide surface comprises metal oxide in a first oxidation state and metal oxide in a second oxidation state. The metal comprises at least two oxidation states.

In accordance with another embodiment of the present invention, a method of forming a metal oxide surface that is enriched with metal oxide in its higher oxidation state for use in a semiconductor device is provided. The method comprises: providing a semiconductor substrate assembly comprising a metal layer and a dielectric layer; and forming a metal oxide surface that is enriched with metal oxide in its higher oxidation state on the metal layer. The step of forming the enriched metal oxide surface comprises: etching the dielectric layer thereby resulting in exposure of the metal layer, wherein the exposure of the metal layer creates a metal oxide surface comprising a metal oxide in a first oxidation state; reducing the metal oxide surface, wherein the reduced metal oxide surface comprises metal oxide in a first oxidation state and metal atom; and oxidizing the reduced metal oxide surface to form a metal oxide surface that is enriched with metal oxide in its higher oxidation state, wherein the enriched metal oxide surface comprises metal oxide in a first oxidation state and metal oxide in a second oxidation state. The metal comprises at least two oxidation states.

In accordance with another embodiment of the present invention, a method of forming a metal oxide surface that is enriched with metal oxide in its higher oxidation state for use in a semiconductor device is provided. The method comprises: providing a metal layer with metal oxide surface supported by a semiconductor substrate, wherein the metal oxide surface comprises metal oxide in a first oxidation state; and forming a metal oxide surface that is enriched with metal oxide in its higher oxidation state on the metal layer. The step of forming the enriched metal oxide surface comprises: reducing the metal oxide surface layer, wherein the reduced metal oxide surface layer comprises metal oxide in a first oxidation state and metal atom; and oxidizing the reduced metal oxide surface to form a metal oxide surface that is enriched with metal oxide in its higher oxidation state, wherein the enriched metal oxide surface comprises metal oxide in a first oxidation state and metal oxide in a second oxidation state. The metal comprises at least two oxidation states.

In accordance with another embodiment of the invention, a method of forming a metal oxide surface that is enriched with metal oxide in its higher oxidation state for use in a semiconductor device is provided. The method comprises: providing a metal layer supported by a semiconductor substrate; and forming a metal oxide surface that is enriched with metal oxide in its higher oxidation state on the metal layer. The step of forming the enriched metal oxide surface comprises oxidizing and reducing the metal oxide surface layer repeatedly until the metal oxide surface is enriched with metal oxide in its higher oxidation state. The metal comprises at least two oxidation states.

In accordance with another embodiment of the present invention, a method of forming a metal oxide surface that is enriched with metal oxide in its higher oxidation state for use in a semiconductor device is provided. The method comprises: providing a metal layer with a metal oxide surface supported by a semiconductor substrate, wherein the metal oxide surface comprises metal oxide in a first oxidation state; and forming a metal oxide surface that is enriched with metal oxide in its higher oxidation state on the metal layer, wherein the step of forming the enriched metal oxide surface comprises reducing and oxidizing the metal oxide surface layer repeatedly until the metal oxide surface is enriched with metal oxide in its higher oxidation state. The metal comprises at least two oxidation states.

In accordance with another embodiment of the present invention, a metal oxide surface that is enriched with metal oxide in its higher oxidation state for use in a semiconductor device comprises: a metal layer supported by a semiconductor substrate; and a metal oxide surface that is enriched with metal oxide in its higher oxidation state on the metal layer. The enriched metal oxide surface comprises metal oxide in a first oxidation state and metal oxide in a second oxidation state.

BRIEF DESCRIPTION OF THE DRAWING FIGURES

DETAILED DESCRIPTION OF THE PREFERRED EMBODIMENTS

Figure 1A:
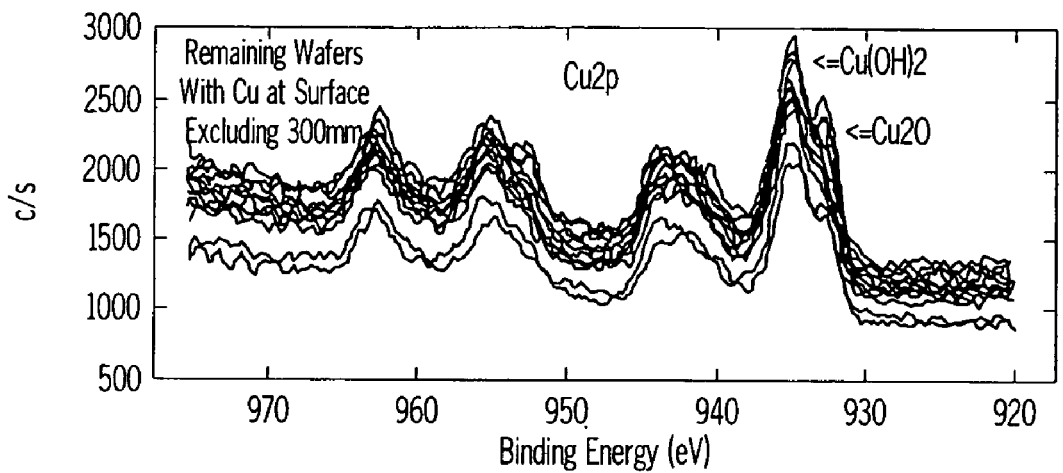
FIGS. 1A and 1B depict a graph of photoelectron intensity versus binding energy for an X-ray photoelectron spectroscopy (XPS) chemical surface analysis of a single strip sequence comprising one oxidizing and one reducing step for a conventional bond pad process.

The present invention is directed to methods for forming a metal oxide surface that is enriched with metal oxide in its higher oxidation state for use in a semiconductor device. The methods of the present invention limit diffusion and penetration of oxygen into the metal layer by providing a metal oxide surface that is enriched with metal oxide in its higher oxidation state. This enriched metal oxide surface is a more stable oxide and therefore promotes less net oxidation over time by protecting the underlying metal layer.

In one embodiment, the methods comprise providing a metal layer supported by a semiconductor substrate; and forming a metal oxide surface that is enriched with metal oxide in its higher oxidation state on the metal layer. One skilled in the art will appreciate the various metal layers which may be used in accordance with the present invention, any of which may be employed herein. In one embodiment, the metal layer comprises a metal with at least two oxidation states. Examples of metal which have at least two oxidation states include, but are not limited to, copper, silver, gold, pulladium platinum and nickel. For purposes of defining and describing the invention, the term "semiconductor substrate" is defined to mean any construction comprising semiconductive materials including, but not limited to, bulk semiconductive materials such as a semiconductive wafer, either alone or in assemblies comprising other materials thereon, and semiconductive material layers, either along or in assemblies comprising other materials. For purposes of defining and describing the invention, the term "substrate" refers to any supporting structure including but not limited to the semiconductor substrates described above. One skilled in the art will appreciate the various materials that can be used to make a semiconductor substrate, any of which may be employed herein. For example, the semiconductor substrate may be made of silicon or any other semiconductive material.

After the metal layer supported by the semiconductor substrate is provided, a metal oxide surface that is enriched with metal oxide in its higher oxidation state is formed on the metal layer. Specifically, the method of forming the enriched metal oxide surface comprises oxidizing the metal layer to form a metal oxide surface, wherein the metal oxide surface comprises metal oxide in a first oxidation state; reducing the metal oxide surface, wherein the reduced metal oxide surface comprises metal oxide in a first oxidation state and metal ion; and oxidizing the reduced metal oxide surface to form a metal oxide surface that is enriched with metal oxide in its higher oxidation state, wherein the enriched metal oxide surface comprises metal oxide in a first oxidation state and metal oxide in a second oxidation state. In another embodiment, the step of forming the enriched metal oxide surface comprises oxidizing and reducing the metal oxide surface layer repeatedly until the metal oxide surface is enriched with metal oxide in its higher oxidation state.

One skilled in the art will appreciate the various methods which may be used for oxidizing and reducing steps to form the enriched metal oxide surface, any of which may be employed herein. In one embodiment, the step of forming the enriched metal oxide surface is performed in a plasma processing chamber. Accordingly, in one embodiment, the step of oxidizing the metal layer and/or oxidizing the reduced metal oxide surface in a plasma processing chamber comprises: flowing an oxidizing gas mixture comprising at least one oxygen contain gas into the plasma processing chamber; striking a plasma in the plasma processing chamber from the oxidizing gas mixture to form an oxidizing plasma; and utilizing the oxidizing plasma to oxidize the metal layer. Alternatively, the step of oxidizing the metal layer and/or oxidizing the reduced metal oxide surface in a plasma processing chamber comprises oxidizing the metal layer to form a metal oxide surface in the plasma processing chamber comprises flowing an oxidizing gas mixture comprising at least one oxygen containing gas and at least one inert gas into the plasma processing chamber; striking a plasma in the plasma processing chamber from the oxidizing gas mixture to form an oxidizing plasma; and utilizing the oxidizing plasma to oxidize the metal layer. In either oxidation method discussed above, the step of reducing the metal oxide surface in a plasma processing chamber comprises: flowing a reducing gas mixture comprising at least one hydrogen containing gas and at least one inert gas into the plasma processing chamber; striking a plasma in the plasma processing chamber from the reducing gas mixture to form a reducing plasma; and utilizing the reducing plasma to reduce the metal oxide surface.

Additionally, in the oxidation and reduction steps discussed in detail above, one skilled in the art will appreciate the various inert gases which may be employed, any of which may be used herein. In one embodiment, the inert gas is selected from the group consisting of argon and nitrogen. Moreover, the oxidizing plasma and/or the reducing plasma may be removed from the plasma processing chamber after the respective oxidizing or reducing step is performed.

The present invention is also directed to methods which comprise providing a semiconductor substrate assembly comprising a metal layer and a dielectric layer and forming a metal oxide surface that is enriched with metal oxide in its higher oxidation state on the metal layer. For purposes of defining and describing the invention, the term "semiconductor substrate assembly" refers to a semiconductor substrate having one or more layers or structures formed thereon. In addition, one skilled in the art will appreciate the various materials which may be employed for the dielectric layer, any of which may be used herein.

In methods comprising a semiconductor substrate assembly, in accordance with the present invention, the first oxidation step is performed by etching the dielectric layer which results in exposure of the metal layer. The exposure of the metal layer creates a metal oxide surface which comprises metal oxide in a first oxidation state. One skilled in the art will appreciate the various means for etching a dielectric layer, any of which may be employed herein. In one embodiment, the etching is performed by an isotropic etch. In addition, as discussed in detail above, the subsequent reduction and oxidation steps may be performed by any methods known in the art. In one embodiment, the subsequent reduction and oxidation steps are conducted in a plasma processing chamber, which steps are discussed in detail above. Moreover, the subsequent reduction and oxidation steps may also be performed repeatedly until the metal oxide surface is enriched with metal oxide in its higher oxidation state.

The present invention is also directed to methods which comprise providing a metal layer with a metal oxide surface supported by a semiconductor substrate, wherein the metal oxide surface comprises metal oxide in a first oxidation state; and forming a metal oxide surface that is enriched with metal oxide in its higher oxidation state on the metal layer. In such methods, the subsequent reduction and oxidation steps may be performed by any means known in the art. In one embodiment, the subsequent reduction and oxidation steps are performed in a plasma processing chamber, which steps as discussed in detailed above. Moreover, the subsequent reduction and oxidation steps may also be performed repeatedly until the metal oxide surface is enriched with metal oxide in its higher oxidation state.

The invention is also directed to a metal oxide surface that is enriched with metal oxide in its higher oxidation state for use in a semiconductor device which comprises: a metal layer supported by a semiconductor substrate; and a metal oxide surface that is enriched with metal oxide in its higher oxidation state on the metal layer. The enriched metal oxide surface comprises metal oxide in a first oxidation state and metal oxide in a second oxidation state.

In each of the various embodiments of the present invention, set out in detail above, the steps of reducing and oxidizing the metal oxide surface may be conducted for about 5 to about 30 seconds. In another embodiment, each step of reducing and oxidizing the metal oxide surface is conducted for about 10 seconds. In addition, the metal oxide surface may be between about 20 Å to about 50 Å thick. In another embodiment the metal oxide surface may be between about 20 Å to about 30 Å thick.

In order that the invention may be more readily understood, reference is made to the following examples, which are intended to be illustrative of the invention, but are not intended to be limiting in scope.

EXAMPLES

Example 1

Figure 1B:
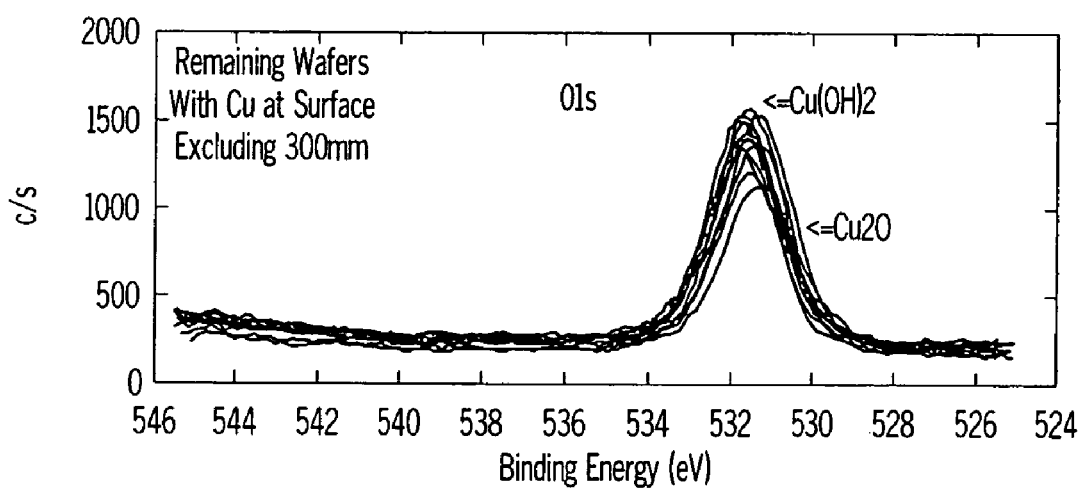

A copper bond pad surface was cleaned in a plasma processing chamber. The copper layer was exposed to an oxidizing plasma followed by a reducing plasma comprising hydrogen gas and nitrogen gas. X-ray photoelectron spectroscopy (XPS) was used to determine the oxidation state(s) of the copper surface layer. FIG. 1A is a graph of photoelectron intensity (c/s) versus binding energy (eV) for copper, while FIG. 1B is a graph of photoelectron intensity (c/s) versus binding energy (eV) for oxygen. As shown in FIGS. 1A and 1B, the resultant copper oxide surface was predominantly comprised of copper oxide in its first oxidation state (+1), i.e. $Cu_2O$ and $Cu(OH)_2$.

Example 2

Figure 2A:
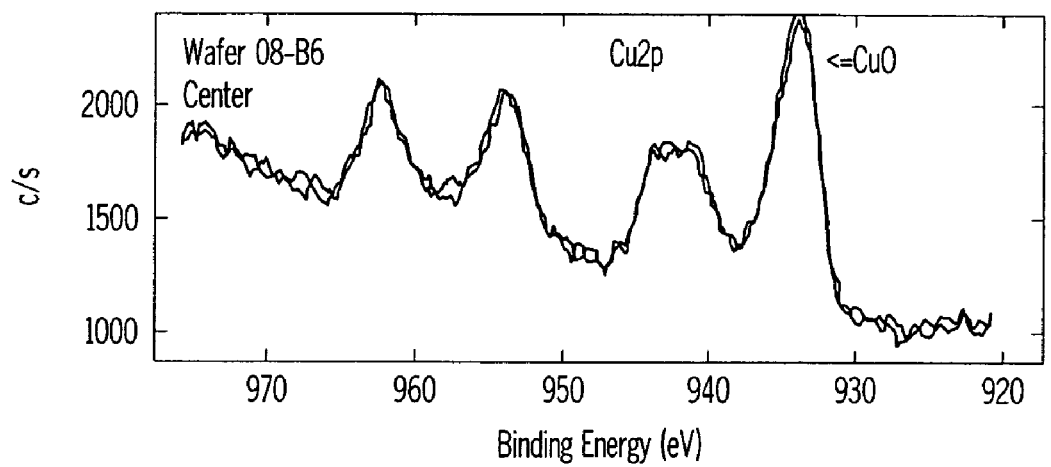
FIGS. 2A and 2B depict an a graph of photoelectron intensity versus binding energy for an X-ray photoelectron spectroscopy (XPS) chemical surface analysis of a strip subsequent to three sequences of alternative oxidation and reduction steps, in accordance with the present invention.
Figure 2B:
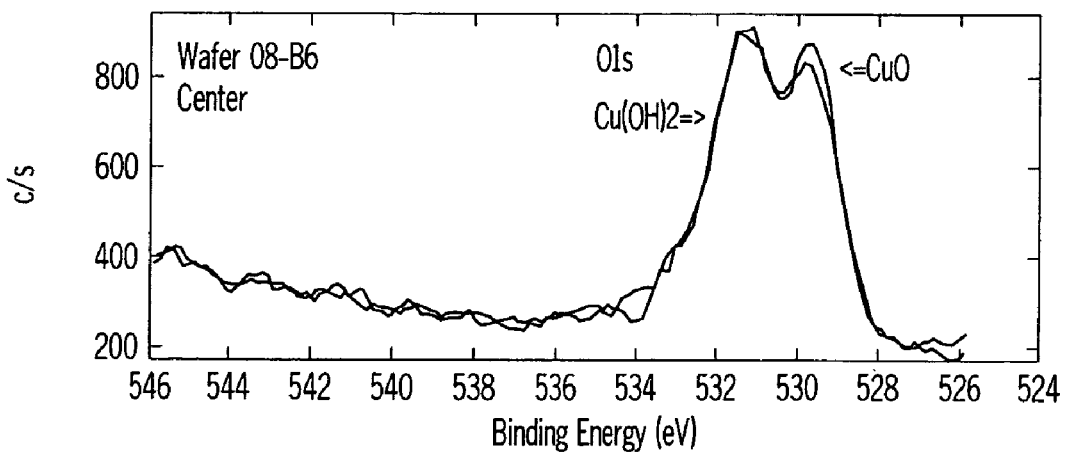

A copper bond pad surface was cleaned in a plasma processing chamber. The copper layer was exposed to was exposed to three alternating oxidation and reduction sequences of an oxidizing plasma followed by a reducing plasma comprising hydrogen gas and nitrogen gas in accordance with an embodiment of the present invention. X-ray photoelectron spectroscopy (XPS) was used to determine the oxidation state(s) of the copper surface layer. FIG. 2A is a graph of photoelectron intensity (c/s) versus binding energy (eV) for copper, while FIG. 2B is a graph of photoelectron intensity (c/s) versus binding energy (eV) for oxygen. As shown in FIGS. 2A and 2B, the resultant copper oxide surface was predominantly comprised of copper oxide in its higher oxidation state (+2), i.e., CuO, with some remaining copper oxide in its first oxidation state i.e. $Cu_2O$ and $Cu(OH)_2$.

While certain representative embodiments and details have been shown for the purpose of illustrating the invention, it will be apparent to those skilled in the art that various changes in the methods and apparatus disclosed herein may be made without departing from the scope of the invention, which is defined in the appended claims.

What is claimed is:

1. A method of forming a metal oxide surface that is enriched with metal oxide in its higher oxidation state for use in a semiconductor device comprising:
   providing a metal layer supported by a semiconductor substrate; and
   forming a metal oxide surface that is enriched with metal oxide in its higher oxidation state on the metal layer, wherein the step of forming the enriched metal oxide surface comprises:
      oxidizing the metal layer to form a metal oxide surface, wherein the metal oxide surface comprises metal oxide in a first oxidation state;
      reducing the metal oxide surface, wherein the reduced metal oxide surface comprises metal oxide in a first oxidation state and metal atom; and
      oxidizing the reduced metal oxide surface to form a metal oxide surface that is enriched with metal oxide in its higher oxidation state, wherein the enriched metal oxide surface comprises metal oxide in a first oxidation state and metal oxide in a second oxidation state, and wherein the metal comprises at least two oxidation states.

2. The method as claimed in claim 1 wherein the metal is copper.

3. The method as claimed in claim 1 wherein each step of forming the metal oxide surface is conducted for about 5 to about 30 seconds.

4. The method as claimed in claim 1 wherein the metal oxide surface is between about 20 Å to about 50 Å thick.

5. A method of forming a metal oxide surface that is enriched with metal oxide in its higher oxidation state for use in a semiconductor device comprising:
   providing a metal layer supported by a semiconductor substrate; and
   forming a metal oxide surface that is enriched with metal oxide in its higher oxidation state on the metal layer in a plasma processing chamber, wherein the step of forming the enriched metal oxide surface comprises:
      oxidizing the metal layer to form a metal oxide surface, wherein the metal oxide surface comprises metal oxide in a first oxidation state, and wherein oxidizing the metal layer comprises: flowing an oxidizing gas mixture comprising at least one oxygen containing gas into the plasma processing chamber; striking a plasma in the plasma processing chamber from the oxidizing gas mixture to form an oxidizing plasma; and utilizing the oxidizing plasma to oxidize the metal layer;
      reducing the metal oxide surface, wherein the reduced metal oxide comprises metal oxide in a first oxidation state and metal atom, and wherein reducing the metal oxide surface comprises: flowing a reducing gas mixture comprising at least one hydrogen containing gas and at least one inert gas into the plasma processing chamber; striking a plasma in the plasma processing chamber from the reducing gas mixture to form a reducing plasma; and utilizing the reducing plasma to reduce the metal oxide surface; and oxidizing the reduced metal oxide surface to form a metal oxide surface that is enriched with metal oxide in its higher oxidation state, wherein the enriched metal oxide surface comprises metal oxide in a first oxidation state and metal oxide in a second oxidation state, and wherein oxidizing the metal oxide surface comprises: flowing an oxidizing gas mixture comprising at least one oxygen containing gas into the plasma processing chamber; striking a plasma in the plasma processing chamber from the oxidizing gas mixture to form an oxidizing plasma; and utilizing the oxidizing plasma to oxidize the reduced metal oxide surface, and wherein the metal comprises at least two oxidation states.

6. The method as claimed in claim 5 wherein the oxidizing plasma or the reducing plasma is removed from the plasma processing chamber after the respective oxidizing or reducing step is performed.

7. The method as claimed in claim 5 wherein each step of forming the metal oxide surface is conducted for about 5 to about 30 seconds.

8. A method of forming a metal oxide surface that is enriched with metal oxide in its higher oxidation state for use in a semiconductor device comprising:

providing a metal layer supported by a semiconductor substrate; and forming a metal oxide surface that is enriched with metal oxide in its higher oxidation state on the metal layer in a plasma processing chamber, wherein the step of forming the enriched metal oxide surface comprises:

oxidizing the metal layer to form a metal oxide surface comprising metal oxide in a first oxidation state, wherein oxidizing the metal layer comprises: flowing an oxidizing gas mixture comprising at least one oxygen containing gas and at least one inert gas into the plasma processing chamber; striking a plasma in the plasma processing chamber from the oxidizing gas mixture to form an oxidizing plasma; and utilizing the oxidizing plasma to oxidize the metal layer;

reducing the metal oxide surface, wherein the reduced metal oxide surface comprises metal oxide in a first oxidation state and metal atom, and wherein reducing the metal oxide surface comprises: flowing a reducing gas mixture comprising at least one hydrogen containing gas and at least one inert gas into the plasma processing chamber; striking a plasma in the plasma processing chamber from the reducing gas mixture to form a reducing plasma; and utilizing the reducing plasma to reduce the metal oxide surface; and oxidizing the reduced metal oxide surface to form a metal oxide surface that is enriched with metal oxide in its higher oxidation state, wherein the enriched metal oxide surface comprises metal oxide in a first oxidation state and metal oxide in a second oxidation state, wherein oxidizing the second metal oxide surface comprises: flowing an oxidizing gas mixture comprising at least one oxygen containing gas and at least one inert gas into the plasma processing chamber; striking a plasma in the plasma processing chamber from the oxidizing gas mixture to form an oxidizing plasma; and utilizing the oxidizing plasma to oxidize the reduced metal oxide surface; wherein the metal comprises at least two oxidation states.

9. The method as claimed in claim 8 wherein the oxidizing plasma or the reducing plasma is removed from the plasma processing chamber after the respective oxidizing or reducing step is performed.

10. The method as claimed in claim 8 wherein each step of forming the metal oxide surface is conducted for about 5 to about 30 seconds.

11. The method according to claim 8 wherein the inert gas is selected from the group consisting of argon and nitrogen.

12. A method of forming a metal oxide surface that is enriched with metal oxide in its higher oxidation state for use in a semiconductor device comprising:

providing a semiconductor substrate assembly comprising a metal layer and a dielectric layer; and forming a metal oxide surface that is enriched with metal oxide in its higher oxidation state on the metal layer, wherein the step of forming the enriched metal oxide surface comprises:

etching the dielectric layer thereby resulting in exposure of the metal layer, wherein the exposure of the metal layer creates a metal oxide surface comprising metal oxide in a first oxidation state;

reducing the metal oxide surface, wherein the reduced metal oxide surface comprises metal oxide in a first oxidation state and metal atom; and oxidizing the reduced metal oxide surface to form a metal oxide surface that is enriched with metal oxide in its higher oxidation state, wherein the enriched metal oxide surface comprises metal oxide in a first oxidation state and metal oxide in a second oxidation state, and wherein the metal comprises at least two oxidation states.

13. The method as claimed in claim 12 wherein the metal is copper.

14. The method as claimed in claim 12 wherein the steps of reducing and oxidizing the metal oxide surface are each conducted for about 5 to about 30 seconds.

15. The method as claimed in claim 12 wherein the metal oxide surface is between about 20 Å to about 50 Å thick.

16. A method of forming a metal oxide surface that is enriched with metal oxide in its higher oxidation state for use in a semiconductor device comprising:

providing a semiconductor substrate assembly comprising a metal layer and a dielectric layer; and forming a metal oxide surface that is enriched with metal oxide in its higher oxidation state on the metal layer in a plasma processing chamber, wherein the step of forming the enriched metal oxide surface comprises:

etching the dielectric layer thereby resulting in exposure of the metal layer, wherein the exposure of the metal layer creates a metal oxide surface comprising metal oxide in a first oxidation state;

reducing the metal oxide surface, wherein the reduced metal oxide surface comprises metal oxide in a first oxidation state and metal atom, and wherein reducing the first metal oxide surface comprises: flowing a reducing gas mixture comprising at least one hydrogen containing gas and at least one inert gas into the plasma processing chamber; striking a plasma in the plasma processing chamber from the reducing gas mixture to form a reducing plasma; and utilizing the reducing plasma to reduce the metal oxide surface; and oxidizing the reduced metal oxide surface to form a metal oxide surface that is enriched with metal oxide in its higher oxidation state, wherein the enriched metal oxide surface comprises metal oxide in a first oxidation state and metal oxide in a second oxidation state, wherein oxidizing the metal oxide surface comprises: flowing an oxidizing gas mixture comprising at least one oxygen containing gas into the plasma processing chamber; striking a plasma in the plasma processing chamber from the oxidizing gas mixture to form an oxidizing plasma; and utilizing the oxidizing plasma to oxidize the reduced metal oxide surface, and wherein the metal comprises at least two oxidation states.

17. The method as claimed in claim 16 wherein the oxidizing plasma or the reducing plasma is removed from the plasma processing chamber after the respective oxidizing or reducing step is performed.

18. The method as claimed in claim 16 wherein the steps of reducing and oxidizing the metal oxide surface are each conducted for about 5 to about 30 seconds.

19. A method of forming a metal oxide surface that is enriched with metal oxide in its higher oxidation state for use in a semiconductor device comprising:
providing a semiconductor substrate assembly comprising a metal layer and a dielectric layer; and
forming a metal oxide surface that is enriched with metal oxide in its higher oxidation state on the metal layer in a plasma processing chamber, wherein the step of forming the enriched metal oxide surface comprises:
etching the dielectric layer thereby resulting in exposure of the metal layer, wherein the exposure of the metal layer creates a metal oxide surface comprising metal oxide in a first oxidation state;
reducing the metal oxide surface, wherein the reduced metal oxide surface comprises metal oxide in a first oxidation state and metal atom, and wherein reducing the metal oxide surface comprises: flowing a reducing gas mixture comprising at least one hydrogen containing gas and at least one inert gas into the plasma processing chamber; striking a plasma in the plasma processing chamber from the reducing gas mixture to form a reducing plasma; and utilizing the reducing plasma to reduce the metal oxide surface; and
oxidizing the reduced metal oxide surface to form a metal oxide surface that is enriched with metal oxide in a higher oxidation state, wherein the enriched metal oxide surface comprises metal oxide in a first oxidation state and metal oxide in a second oxidation state, and wherein oxidizing the metal oxide surface comprises: flowing an oxidizing gas mixture comprising at least one oxygen containing gas and at least one inert gas into the plasma processing chamber; striking a plasma in the plasma processing chamber from the oxidizing gas mixture to form an oxidizing plasma; and utilizing the oxidizing plasma to oxidize the reduced metal oxide surface; wherein the metal comprises at least two oxidation states.

20. The method as claimed in claim 19 wherein the oxidizing plasma or the reducing plasma is removed from the plasma processing chamber after the respective or oxidizing step is performed.

21. The method as claimed in claim 19 wherein the steps of reducing and oxidizing the metal oxide surface are each conducted for about 5 to about 30 seconds.

22. The method according to claim 19 wherein the inert gas is selected from the group consisting of argon and nitrogen.

23. A method of forming a copper oxide surface that is enriched with copper oxide in its higher oxidation state for use in a semiconductor device comprising:
providing a copper layer supported by a semiconductor substrate; and
forming a copper oxide surface that is enriched with copper oxide in its higher oxidation state on the copper layer, wherein the step of forming the enriched copper oxide surface comprises:
oxidizing the copper layer to form a copper oxide surface comprising copper oxide in a first oxidation state;
reducing the copper oxide surface, wherein the reduced copper oxide surface comprises copper oxide in a first oxidation state and copper atom; and
oxidizing the reduced copper oxide surface to form a copper oxide surface that is enriched with copper oxide in its higher oxidation state, wherein the enriched copper oxide surface comprises copper oxide in a first oxidation state and copper oxide in a second oxidation state.

24. The method as claimed in claim 23 wherein each step of forming the copper oxide surface is conducted for about 5 to about 30 seconds.

25. The method as claimed in claim 23 wherein the copper oxide surface is between about 20 Å to about 50 Å thick.

26. A method of forming a copper oxide surface that is enriched with copper oxide in its higher oxidation state for use in a semiconductor device comprising:
providing a copper layer supported by a semiconductor substrate; and
forming a copper oxide surface that is enriched with copper oxide in its higher oxidation state on the copper layer in a plasma processing chamber, wherein the step of forming the enriched copper oxide surface comprises:
oxidizing the copper layer to form a copper oxide surface comprising copper oxide in a first oxidation state, wherein oxidizing the copper layer comprises: flowing an oxidizing gas mixture comprising at least one oxygen containing gas into the plasma processing chamber; striking a plasma in the plasma processing chamber from the oxidizing gas mixture to form an oxidizing plasma; and utilizing the oxidizing plasma to oxidize the copper layer;
reducing the copper oxide surface, wherein the reduced copper oxide surface comprises copper oxide in a first oxidation state and copper ion, and wherein reducing the copper oxide surface comprises: flowing a reducing gas mixture comprising at least one hydrogen containing gas and at least one inert gas into the plasma processing chamber; striking a plasma in the plasma processing chamber from the reducing gas mixture to form a reducing plasma; and utilizing the reducing plasma to reduce the copper oxide surface; and
oxidizing the reduced copper oxide surface to form a copper oxide surface that is enriched with copper oxide in its higher oxidation state, wherein the enriched copper oxide surface comprises copper oxide in a first oxidation state and copper oxide in a second oxidation state, and wherein oxidizing the second copper oxide surface comprises: flowing an oxidizing gas mixture comprising at least one oxygen containing gas into the plasma processing chamber; striking a plasma in the plasma processing chamber from the oxidizing gas mixture to form an oxidizing plasma; and utilizing the oxidizing plasma to oxidize the reduced copper oxide surface.

27. The method as claimed in claim 26 wherein the oxidizing plasma or the reducing plasma is removed from the plasma processing chamber after the respective oxidizing or reducing step is performed.

28. The method as claimed in claim 26 wherein each step of forming the copper oxide surface is conducted for about 5 to about 30 seconds.

29. A method of forming a copper oxide surface that is enriched with copper oxide in its higher oxidation state for use in a semiconductor device comprising:
 providing a copper layer supported by a semiconductor substrate; and
 forming a copper oxide surface that is enriched with copper oxide in its higher oxidation state on the copper layer in a plasma processing chamber, wherein the step of forming the enriched copper oxide surface comprises:
  oxidizing the copper layer to form a copper oxide surface comprising copper oxide in a first oxidation state, wherein oxidizing the copper layer comprises: flowing an oxidizing gas mixture comprising at least one oxygen containing gas and at least one inert gas into the plasma processing chamber; striking a plasma in the plasma processing chamber from the oxidizing gas mixture to form an oxidizing plasma; and utilizing the oxidizing plasma to oxidize the copper layer;
  reducing the copper oxide surface, wherein the reduced copper oxide surface comprises copper oxide in a first oxidation state and copper ion, wherein reducing the copper oxide surface comprises: flowing a reducing gas mixture comprising at least one hydrogen containing gas and at least one inert gas into the plasma processing chamber; striking a plasma in the plasma processing chamber from the reducing gas mixture to form a reducing plasma; and utilizing the reducing plasma to reduce the copper oxide surface; and
  oxidizing the reduced copper oxide surface to form a copper oxide surface that is enriched with copper oxide in its higher oxidation state, wherein the enriched copper oxide surface comprises copper oxide in a first oxidation state and copper oxide in a second oxidation state, wherein oxidizing the second copper oxide surface comprises: flowing an oxidizing gas mixture comprising at least one oxygen containing gas and at least one inert gas into the plasma processing chamber; striking a plasma in the plasma processing chamber from the oxidizing gas mixture to form an oxidizing plasma; and utilizing the oxidizing plasma to oxidize the reduced copper oxide surface.

30. The method as claimed in claim 29 wherein the oxidizing plasma or the reducing plasma is removed from the plasma processing chamber after the respective oxidizing or reducing step is performed.

31. The method as claimed in claim 29 wherein each step of forming the copper oxide surface is conducted for about 5 to about 30 seconds.

32. The method according to claim 29 wherein the inert gas is selected from the group consisting of argon and nitrogen.

33. A method of forming a copper oxide surface that is enriched with copper oxide in its higher oxidation state for use in a semiconductor device comprising:
 providing a semiconductor substrate assembly comprising a copper layer and a dielectric layer; and
 forming a copper oxide surface that is enriched with copper oxide in its higher oxidation state on the copper layer, wherein the step of forming the enriched copper oxide surface comprises:
  etching the dielectric layer thereby resulting in exposure of the copper layer, wherein the exposure of the copper layer creates a copper oxide surface comprising copper oxide in a first oxidation state;
  reducing the copper oxide surface, wherein the reduced copper oxide surface comprises copper oxide in a first oxidation state and copper atom; and
  oxidizing the reduced copper oxide surface to form a copper oxide surface that is enriched with copper oxide in its higher oxidation state, wherein the enriched copper surface comprises copper oxide in a first oxidation state and copper oxide in a second oxidation state.

34. The method as claimed in claim 33 wherein the steps of reducing and oxidizing the copper oxide surface are each conducted for about 5 to about 30 seconds.

35. The method as claimed in claim 33 wherein the copper oxide surface is between about 20 Å to about 50 Å thick.

36. A method of forming a copper oxide surface that is enriched with copper oxide in its higher oxidation state for use in a semiconductor device comprising:
 providing a semiconductor substrate assembly comprising a copper layer and a dielectric layer; and
 forming a copper oxide surface that is enriched with copper oxide in its higher oxidation state on the copper layer in a plasma processing chamber, wherein the step of forming the enriched copper oxide surface comprises:
  etching the dielectric layer thereby resulting in exposure of the copper layer, wherein the exposure of the copper layer creates a copper oxide surface comprising copper oxide in a first oxidation state;
  reducing the copper oxide surface, wherein the reduced copper oxide surface comprises copper oxide in a first oxidation state and copper atom, wherein reducing the copper oxide surface comprises: flowing a reducing gas mixture comprising at least one hydrogen containing gas and at least one inert gas into the plasma processing chamber; striking a plasma in the plasma processing chamber from the reducing gas mixture to form a reducing plasma; and utilizing the reducing plasma to reduce the copper oxide surface; and
  oxidizing the reduced copper oxide surface to form a copper oxide surface that is enriched with copper oxide in its higher oxidation state, wherein the enriched copper oxide surface comprises copper oxide in a first oxidation state and copper oxide in a second oxidation state, and wherein oxidizing the copper oxide surface comprises: flowing an oxidizing gas mixture comprising at least one oxygen containing gas into the plasma processing chamber; striking a plasma in the plasma processing chamber from the oxidizing gas mixture to form an oxidizing plasma; and utilizing the oxidizing plasma to oxidize the reduced copper oxide surface.

37. The method as claimed in claim 36 wherein the oxidizing plasma or the reducing plasma is removed from the plasma processing chamber after the respective oxidizing or reducing step is performed.

38. The method as claimed in claim 36 wherein the steps of reducing and oxidizing the copper oxide surface are each conducted for about 5 to about 30 seconds.

39. A method of forming a copper oxide surface that is enriched with copper oxide in its higher oxidation state for use in a semiconductor device comprising:
  providing a semiconductor substrate assembly comprising a copper layer and a dielectric layer; and
  forming a copper oxide surface that is enriched with copper oxide in its higher oxidation state on the copper layer in a plasma processing chamber, wherein the step of forming the enriched copper oxide surface comprises:
    etching the dielectric layer thereby resulting in exposure of the copper layer, wherein the exposure of the copper layer creates a copper oxide surface comprising copper oxide in a first oxidation state;
    reducing the copper oxide surface, wherein the reduced copper oxide surface comprises copper oxide in a first oxidation state and copper atom, and wherein reducing the copper oxide surface comprises: flowing a reducing gas mixture comprising at least one hydrogen containing gas and at least one inert gas into the plasma processing chamber; striking a plasma in the plasma processing chamber from the reducing gas mixture to form a reducing plasma; and utilizing the reducing plasma to reduce the copper oxide surface; and
    oxidizing the reduced copper oxide surface to form a copper oxide surface that is enriched with copper oxide in its higher oxidation state, wherein the enriched copper oxide surface comprises copper oxide in a first oxidation state and copper oxide in a second oxidation state, and wherein oxidizing the copper oxide surface comprises: flowing an oxidizing gas mixture comprising at least one oxygen containing gas and at least one inert gas into the plasma processing chamber; striking a plasma in the plasma processing chamber from the oxidizing gas mixture to form an oxidizing plasma; and utilizing the oxidizing plasma to oxidize the reduced copper oxide surface.

40. The method as claimed in claim 39 wherein the oxidizing plasma or the reducing plasma is removed from the plasma processing chamber after the respective or oxidizing step is performed.

41. The method as claimed in claim 39 wherein the steps of reducing and oxidizing the copper oxide surface are each conducted for about 5 to about 30 seconds.

42. The method according to claim 39 wherein the inert gas is selected from the group consisting of argon and nitrogen.

43. A metal oxide surface that is enriched with metal oxide in its higher oxidation state for use in a semiconductor device comprising:
  a metal layer supported by a semiconductor substrate; and
  a metal oxide surface that is enriched with metal oxide in its higher oxidation state on the metal layer, wherein the enriched metal oxide surface comprises metal oxide in a first oxidation state and metal oxide in a second oxidation state.

44. The semiconductor device as claimed in claim 43 wherein the metal oxide surface is between about 20 Å to about 50 Å thick.

45. A copper oxide surface that is enriched with copper oxide in its higher oxidation state for use in a semiconductor device comprising:
  a copper layer supported by a semiconductor substrate; and
  a copper oxide surface that is enriched with copper oxide in its higher oxidation state on the copper layer, wherein the enriched copper oxide surface comprises copper oxide in a first oxidation state and copper oxide in a second oxidation state.

46. The semiconductor device as claimed in claim 45 wherein the copper oxide surface is between about 20 Å to about 50 Å thick.

47. A method of forming a metal oxide surface that is enriched with metal oxide in its higher oxidation state for use in a semiconductor device comprising:
  providing a metal layer with metal oxide surface supported by a semiconductor substrate, wherein the metal oxide surface comprises metal oxide in a first oxidation state; and
  forming a metal oxide surface that is enriched with metal oxide in its higher oxidation state on the metal layer, wherein the step of forming the enriched metal oxide surface comprises:
    reducing the metal oxide surface layer, wherein the reduced metal oxide surface layer comprises metal oxide in a first oxidation state and metal atom; and
    oxidizing the reduced metal oxide surface to form a metal oxide surface that is enriched with metal oxide in its higher oxidation state, wherein the enriched metal oxide surface comprises metal oxide in a first oxidation state and metal oxide in a second oxidation state; wherein the metal comprises at least two oxidation states.

48. The method as claimed in claim 47 wherein metal is copper.

49. The method as claimed in claim 47 wherein each step of forming the metal oxide surface is conducted for about 5 to about 30 seconds.

50. The method as claimed in claim 47 wherein the metal oxide surface is between about 20 Å to about 50 Å thick.

51. A method of forming a copper oxide surface that is enriched with copper oxide in its higher oxidation state for use in a semiconductor device comprising:
  providing a copper layer with copper oxide surface supported by a semiconductor substrate, wherein the copper oxide surface comprises copper oxide in a first oxidation state; and
  forming a copper oxide surface that is enriched with copper oxide in its higher oxidation state on the copper layer, wherein the step of forming the enriched copper oxide surface comprises:
    reducing the copper oxide surface layer, wherein the reduced copper oxide surface layer comprises copper oxide in a first oxidation state and copper atom; and
    oxidizing the reduced copper oxide surface to form a copper oxide surface that is enriched with copper oxide in its higher oxidation state, wherein the enriched copper oxide surface comprises copper oxide in a first oxidation state and copper oxide in a second oxidation state.

52. The method as claimed in claim 51 wherein each step of forming the metal oxide surface is conducted for about 5 to about 30 seconds.

53. The method as claimed in claim 51 wherein the metal oxide surface is between about 20 Å to about 50 Å thick.

54. A method of forming a metal oxide surface that is enriched with metal oxide in its higher oxidation state for use in a semiconductor device comprising:
- providing a metal layer supported by a semiconductor substrate; and
- forming a metal oxide surface that is enriched with metal oxide in its higher oxidation state on the metal layer, wherein the step of forming the enriched metal oxide surface comprises oxidizing and reducing the metal oxide surface layer repeatedly until the metal oxide surface is enriched with metal oxide in its higher oxidation state; wherein the metal comprises at least two oxidation states.

55. A method of forming a metal oxide surface that is enriched with metal oxide in its higher oxidation state for use in a semiconductor device comprising:
- providing a metal layer with a metal oxide surface supported by a semiconductor substrate, wherein the metal oxide surface comprises metal oxide in a first oxidation state; and
- forming a metal oxide surface that is enriched with metal oxide in its higher oxidation state on the metal layer, wherein the step of forming the enriched metal oxide surface comprises reducing and oxidizing the metal oxide surface layer repeatedly until the metal oxide surface is enriched with metal oxide in its higher oxidation state; wherein the metal comprises at least two oxidation states.

* * * * *